United States Patent
Nguyen et al.

(10) Patent No.: US 7,160,802 B2
(45) Date of Patent: Jan. 9, 2007

(54) ADHESION OF TUNGSTEN NITRIDE FILMS TO A SILICON SURFACE

(75) Inventors: Huong T. Nguyen, San Ramon, CA (US); Dennis Hausmann, Los Gatos, CA (US)

(73) Assignee: Novellus Systems, Inc., San Jose, CA (US)

( * ) Notice: Subject to any disclaimer, the term of this patent is extended or adjusted under 35 U.S.C. 154(b) by 0 days.

(21) Appl. No.: 11/146,884

(22) Filed: Jun. 6, 2005

(65) Prior Publication Data

US 2006/0276033 A1 Dec. 7, 2006

(51) Int. Cl.
*H01L 21/44* (2006.01)
(52) U.S. Cl. ............ 438/648; 438/685; 438/762; 438/765; 438/791; 257/E23.118; 257/E21.292
(58) Field of Classification Search ........ 438/648, 438/685, 791, 765, 762, FOR. 394, FOR. 401, 438/FOR. 402, FOR. 403; 257/E23.118, 257/E21.292
See application file for complete search history.

(56) References Cited

U.S. PATENT DOCUMENTS 6,559,050 B1 * 5/2003 McKee et al. ............ 438/656
2003/0020180 A1 * 1/2003 Ahn et al. ............ 257/786
2003/0224217 A1 * 12/2003 Byun et al. ............ 428/698
2004/0115929 A1 * 6/2004 Lim ............ 438/643
2005/0170642 A1 * 8/2005 Hineman et al. ............ 438/637
2006/0048702 A1 * 3/2006 Son et al. ............ 117/94
2006/0057804 A1 * 3/2006 Saito et al. ............ 438/254
2006/0094238 A1 * 5/2006 Levy et al. ............ 438/656

OTHER PUBLICATIONS

Ghandhi, Sorab, "VLSI Fabrication Principles", 1983, John Wiley & Sons, Inc., pp. 517-520.*

* cited by examiner

*Primary Examiner*—Michelle Estrada
(74) *Attorney, Agent, or Firm*—Patent Law Group LLP.; Brian D. Ogonowsky

(57) ABSTRACT

A process is described that forms a low resistivity connection between a tungsten layer and a silicon surface with high adherence of the tungsten to the silicon. The silicon surface is plasma-cleaned to remove native oxide. A very thin layer (one or more monolayers) of Si—$NH_2$ is formed on the silicon surface, serving as an adhesion layer. A $WN_x$ layer is formed over the Si—$NH_2$ layer, using an atomic layer deposition (ALD) process, to serve as a barrier layer. A thick tungsten layer is formed over the $WN_x$ layer by CVD. An additional metal layer (e.g., aluminum) may be formed over the tungsten layer.

13 Claims, 3 Drawing Sheets

ADHESION OF TUNGSTEN NITRIDE FILMS TO A SILICON SURFACE

FIELD OF THE INVENTION

This invention relates to semiconductor processing and, in particular, to forming a low resistivity and high adherence interface between a tungsten layer and a silicon surface.

BACKGROUND

Tungsten (W) is a common metal used for conductors on a silicon wafer. A tungsten layer is typically formed using a CVD process where $WF_6 + SiH_4$ (silane) gases react to leave a layer of tungsten on a surface. Tungsten is not directly deposited on silicon since the fluorine in the $WF_6$ reacts with the silicon to degrade the adhesion of the tungsten layer and etches the silicon surface. Additionally, the W atoms will migrate into the silicon.

It is known to form a thin oxide layer on the silicon surface and then form the tungsten layer over the oxide. This results in a thick tungsten layer, a thin $WO_x$ interface layer, and a thin oxide layer beneath the surface of the wafer. The $WO_x$ and oxide layers are highly resistive, resulting in poor electrical contact between the tungsten layer and the silicon.

Accordingly, a non-tungsten barrier layer (e.g., Ti) is typically formed between the tungsten layer and the silicon, as shown in FIG. 1.

FIG. 1 is a cross-sectional view of one application of using tungsten to electrically contact silicon. An oxide layer 10 formed over a silicon substrate 12 is etched to expose a portion of the silicon. The exposed portion may be a doped region of an electronic device, such as a transistor or diode, or any other silicon region. A multi-layered barrier layer 14 of Ti/TiN is first formed over the silicon to improve adhesion of the overlying tungsten layer, protect the silicon from fluorine during the subsequent $WF_6$ exposure, and block W atoms from migrating into the silicon.

A conventional CVD tungsten deposition process is then performed to form a relatively thick layer of tungsten 16. The tungsten layer may be patterned and etched for defining a conductive plug for being contacted by a subsequent aluminum layer or for otherwise forming a conductor to other components.

Forming the Ti/TiN barrier requires steps that significantly add to the cost of processing the wafer.

SUMMARY

A process is described that does not use any non-tungsten barrier layer between silicon and a tungsten layer, yet the process forms a low resistivity connection between the tungsten layer and the silicon with high adherence of the tungsten to the silicon.

The process steps in one embodiment are as follows.

The silicon surface is plasma-cleaned to remove native oxide.

A very thin layer (one or more monolayers) of Si—$NH_2$ is formed on the silicon surface by introducing a NH based gas at the end of the cleaning process. This layer serves primarily as an adhesion layer.

Using an atomic layer deposition (ALD) process, a $WN_x$ layer is formed over the Si—$NH_2$ layer using $WF_6$ and a nitrogen based gas. All or a portion of the $NH_2$ layer may be converted to $WN_x$. This layer serves primarily as a barrier layer.

Optionally, the $WN_x$ layer surface is treated using a nitrogen based gas to create additional barrier layers for additional protection of the silicon.

A thick tungsten layer is then formed over the $WN_x$ layer by CVD.

The above process results in a higher quality contact than achieved in prior processes, and the process is highly efficient and reliable.

BRIEF DESCRIPTION OF THE DRAWINGS

Elements with the same numbers in the various figures are the same.

DETAILED DESCRIPTION

Figure 2:
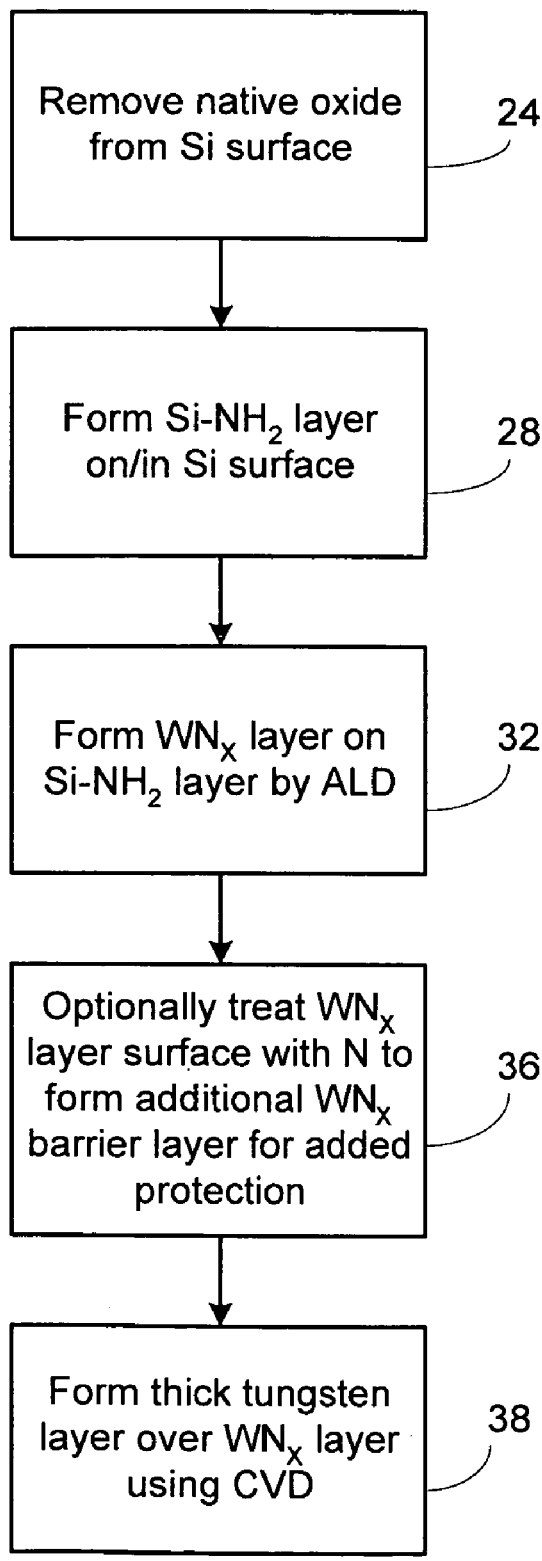
FIG. 2 is a flowchart of one embodiment of the inventive process for forming a barrier layer.

FIG. 2 identifies the basic steps in the process for creating a high quality contact between tungsten and silicon, and FIGS. 3–6 illustrate the process being performed on a silicon wafer.

Figure 3:
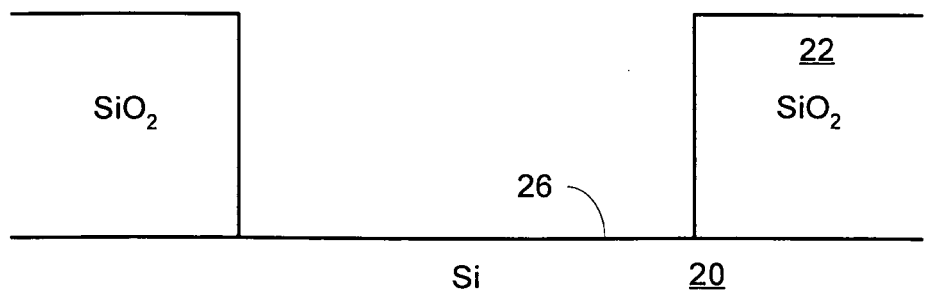
FIGS. 3, 4, 5, and 6 are cross-sectional views of a silicon wafer undergoing the inventive process.
Figure 4:
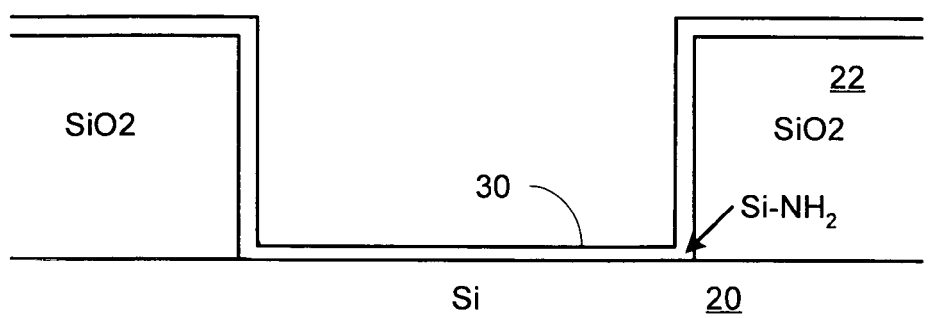
Figure 5:
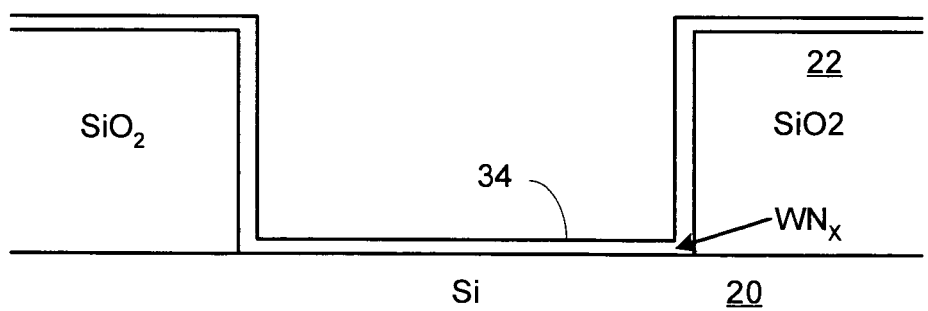
Figure 6:
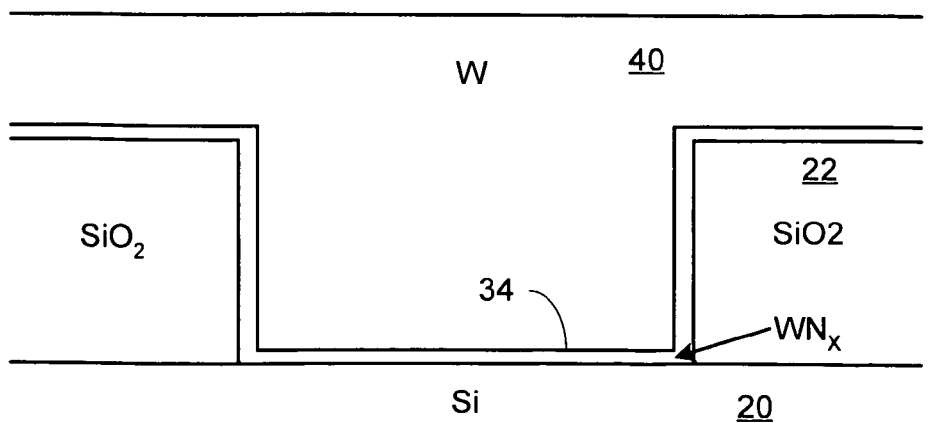

FIG. 3 illustrates a standard silicon substrate 20 having deposited over it an oxide layer 22. The oxide layer 22 is not relevant to the invention but illustrates a typical use of tungsten in semiconductor processing. Tungsten is commonly used as a conductive plug to fill a trench or hole formed in oxide and act as an interface between the silicon and an aluminum layer, where the aluminum layer provides the main conductive paths for the integrated circuit. The exposed silicon is usually a doped region forming part of a semiconductor device such as a transistor or diode.

In step 24 of FIG. 2, the wafer of FIG. 3 is placed in a conventional plasma cleaning chamber to remove any native oxide from the exposed silicon surface 26. The plasma cleaning chamber may use inductively coupled plasma (ICP) to clean the silicon using energized argon ions. In one embodiment, the Ar gas flow is 20 sccm, the power is 500 W-s, the mean bias on the wafer is 300 W, and the etch is conducted for 12.5 seconds. Many other cleaning techniques are also suitable.

Examples of creating a plasma for cleaning a wafer are found in U.S. Pat. Nos. 6,630,201 and 5,180,432, and U.S. patent application Publication US 2002/0160125 A1, all incorporated herein by reference.

In step 28, a thin Si—$NH_2$ layer 30 (FIG. 4) is formed on the substrate 20 to enhance adhesion of the subsequent $WN_x$ layer. The Si—$NH_2$ layer 30 is formed in the cleaning chamber by flowing Ar, $H_2$, and $N_2$ gas at a rate of 20 sccm, with a power of 750 W-s, for less than one minute. In one embodiment, the gas was flowed for between 1–5 seconds with good results. The wafer is not biased. The resulting thickness of the Si—$NH_2$ layer 30 is on the order of monolayers, such as 1–3 nm. Since the silicon becomes part of the composition, the Si—$NH_2$ layer 30 extends below the wafer surface.

In another embodiment, the gas flowed may be any combination of $H_2/N_2$, $H_2/NH_3$, $NH_3$, $WF_6/N_2$, with or without plasma at a high wafer temperature.

$NH_2$ is called an amide, so forming the Si—$NH_2$ layer 30 is referred to as amidating this Si surface.

Since $SiN_x$ is resistive, the Si—$NH_2$ layer 30 should be only as thick as necessary for adequate adhesive of the $WN_x$ layer.

In step 32, the wafer is removed from the cleaning chamber and placed in an atomic layer deposition (ALD) chamber. If the cleaning chamber can also perform ALD, then the wafer does not have to be transferred to another chamber.

Cycles of gases $B_2H_6 \rightarrow WF_6 \rightarrow NH_3$ are introduced into the ALD chamber. These gases react at the surface of the wafer to form a monolayer (e.g., 1 Å) of $WN_x$ each cycle. The entire Si—$NH_2$ layer 30 is preferably converted into a layer of $WN_x$. The adhesion of $WN_x$ to the silicon is strong due to covalent bonding.

The ALD process is repeated to form a $WN_x$ layer 34 of any thickness. For example, there may be on the order of 50 cycles to achieve the desired thickness (e.g., 50 Å). In one embodiment, the thickness is 30–100 Å. A thicker $WN_x$ layer 34 provides additional protection of the silicon surface from fluoride in the $WF_6$. In one embodiment, x is 4 or 5.5; however, a viable range of x is between 1 and 6.

Optionally, a first cycle of $NH_3 \rightarrow WF_6$ may improve the first monolayer of $WN_x$ prior to the $B_2H_6 \rightarrow WF_6 \rightarrow NH_3$ cycles.

Optionally, as shown in step 36, after the 50 Å $WN_x$ layer 34 is formed, any combination of $N_2$, $H_2/N_2$, $NH_3$, $N_2O$ gases are introduced to form a nitrogen based monolayer on the top surface of the $WN_x$ layer 34. When the thick W layer is subsequently deposited, an additional $WN_x$ barrier layer (a monolayer) will be formed to provide additional protection of the silicon.

Suitable ALD reactors are commercially available.

In step 38, the wafer is placed in a CVD chamber, and a thick W layer 40 is formed by flowing $WF_6$ and $SiH_4$ gases. In one embodiment, the thickness is 400 Å. The W layer 40 may be patterned for use as a plug or for another use.

Figure 1:
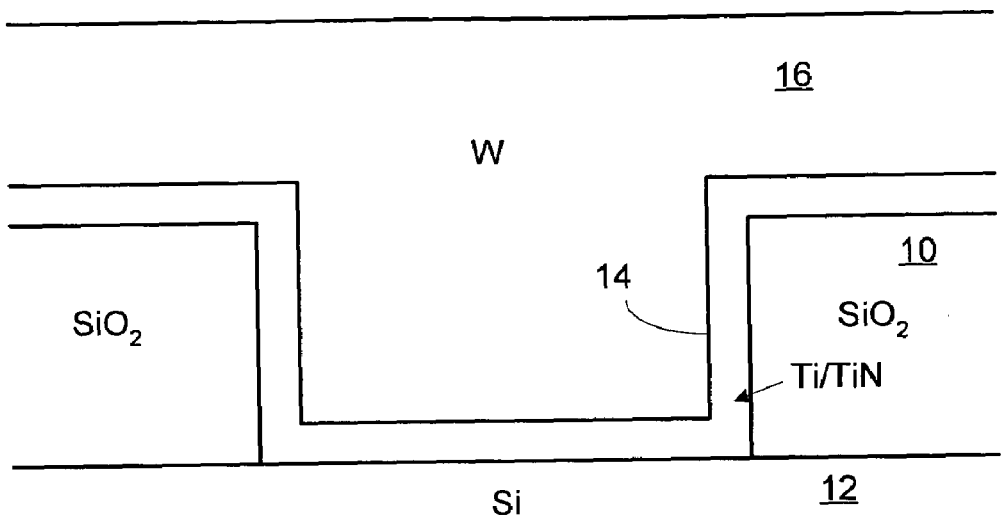
FIG. 1 is a cross-sectional view of a prior art barrier layer between tungsten and silicon.
Figure 7:
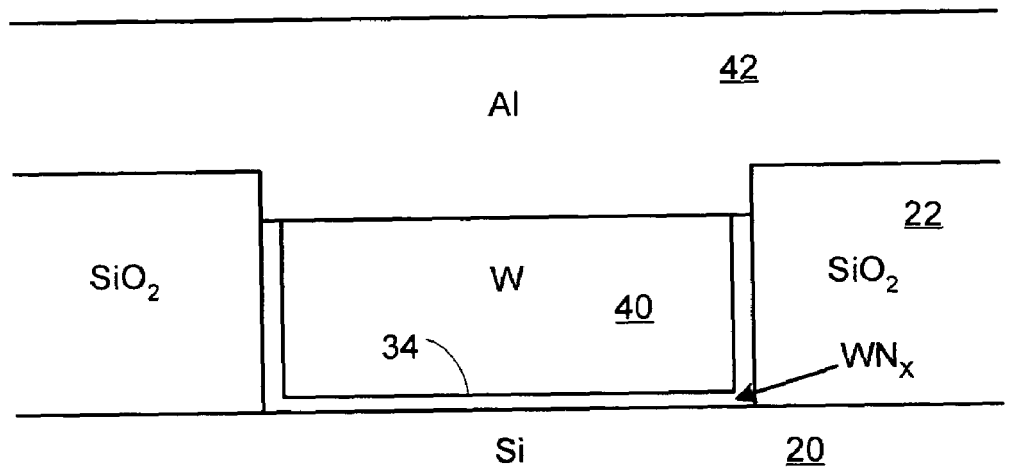
FIG. 7 illustrates an aluminum layer formed over the patterned tungsten layer.

In one example, as shown in FIG. 7, the W layer 40 is patterned by etching, and an aluminum layer 42 is deposited over the patterned W layer to form a conductor pattern for an integrated circuit.

The silicon is protected from the W layer 40 and the fluorine by the $WN_x$ barrier layer, and the barrier layer provides good adhesion for the W layer 40 with very low resistivity.

Having described the invention in detail, those skilled in the art will appreciate that, given the present disclosure, modifications may be made to the invention without departing from the spirit and invention concepts described herein. Therefore, it is not intended that the scope of the invention be limited to the specific embodiments illustrated and described.

What is claimed is:

1. A method for forming a conductor on a silicon surface comprising:

removing native oxide from the silicon surface, wherein removing the native oxide comprises cleaning he silicon surface using a plasma etch;

forming a first nitrogen-containing layer on the silicon surface;

forming a first $WN_x$ layer over the nitrogen-containing layer by atomic layer deposition, the first $WN_x$ layer forming a barrier layer, wherein x is between 1 and 6;

forming a second nitrogen-containing layer over the surface of the first $WN_x$ layer, forming the second nitrogen-containing layer comprising providing a gas that contains nitrogen, but no gases containing tungsten, to the top surface of the first $WN_x$ layer; and depositing a tungsten layer directly over the second nitrogen-containing layer, the tungsten layer reacting with the second nitrogen-containing layer so as to form a second $WN_x$ layer over the first $WN_x$ layer for additional protection of the silicon, depositing the tungsten layer over the second nitrogen-containing layer also forming a tungsten layer over the second $WN_x$ layer, where the tungsten layer over the second $WN_x$ layer does not contain nitrogen and acts as a highly conductive layer, the tungsten layer not containing nitrogen being thicker than the first $WN_x$ layer and the second $WN_x$ layer.

2. A method for forming a conductor on a silicon surface comprising:

removing native oxide from the silicon surface;

forming a first nitrogen-containing layer on the silicon surface, wherein forming the first nitrogen-containing layer comprises introducing a nitrogen-based gas into a cleaning chamber used to remove the native oxide from the silicon surface;

forming a first $WN_x$ layer over the first nitrogen-containing layer by atomic layer deposition, the first $WN_x$ layer forming a barrier layer, wherein x is between 1 and 6;

forming a second nitrogen-containing layer over the surface of the first $WN_x$ layer, forming the second nitrogen-containing layer comprising providing a gas that contains nitrogen, but no gases containing tungsten, to the top surface of the first $WN_x$ layer; and depositing a tungsten layer directly over the second nitrogen-containing layer, the tungsten layer reacting with the second nitrogen-containing layer so as to form a second $WN_x$ layer over the first $WN_x$ layer for additional protection of the silicon, depositing the tungsten layer over the second nitrogen-containing layer also forming a tungsten layer over the second $WN_x$ layer, where the tungsten layer over the second $WN_x$ layer does not contain nitrogen and acts as a highly conductive layer, the tungsten layer not containing nitrogen being thicker than the first $WN_x$ layer and the second $WN_x$ layer.

3. A method for forming a conductor on a silicon surface comprising:

removing native oxide from the silicon surface;

forming a first nitrogen-containing layer on the silicon surface, wherein forming the first nitrogen-containing layer on the silicon surface comprises forming a Si—$NH_2$ layer on the silicon surface;

forming a first $WN_x$ layer over the first nitrogen-containing layer by atomic layer deposition, the first $WN_x$ layer forming a barrier layer, wherein x is between 1 and 6;

forming a second nitrogen-containing layer over the surface of the first $WN_x$ layer, forming the second nitrogen-containing layer comprising providing a gas that contains nitrogen, but no gases containing tungsten, to the top surface of the first $WN_x$ layer; and depositing a tungsten layer directly over the second nitrogen-containing layer, the tungsten layer reacting with the second nitrogen-containing layer so as to form a second $WN_x$ layer over the first $WN_x$ layer for additional protection of the silicon, depositing the tungsten layer over the second nitrogen-containing layer also forming a tungsten layer over the second $WN_x$ layer, where the tungsten layer over the second $WN_x$ layer does not contain nitrogen and acts as a highly conductive layer, the tungsten layer not containing nitrogen being thicker than the first $WN_x$ layer and the second $WN_x$ layer.

4. The method of claim 3 wherein forming a Si—NH$_2$ layer comprises flowing Ar, H$_2$, and N$_2$ gas into a cleaning chamber for less than one minute.

5. The method of claim 4 wherein forming a Si—NH$_2$ layer comprises flowing Ar, H$_2$, and N$_2$ gas into a cleaning chamber for 5 seconds or less.

6. A method for forming a conductor on a silicon surface comprising:
   removing native oxide from the silicon surface;
   forming a nitrogen-containing layer on the silicon surface; and
   forming a WN$_x$ layer over the nitrogen-containing layer by atomic layer deposition, the WN$_x$ layer forming a barrier layer, wherein x is between 1 and 6; and
   depositing a tungsten layer over the WN$_x$ layer;
   wherein forming the WN$_x$ layer comprises:
      introducing a first cycle of gases NH$_3$→WF$_6$ into an ALD chamber to form a first WN$_x$ monolayer; and
      introducing cycles of gases B$_2$H$_6$→WF$_6$→NH$_3$ into the ALD chamber to form successive second layers of WN$_x$ over the first WN$_x$ monolayer until the second layers of WN$_x$ are of a desired thickness.

7. A method for forming a conductor on a silicon surface comprising:
   removing native oxide from the silicon surface;
   forming a first nitrogen-containing layer on the silicon surface;
   forming a first WN$_x$ layer over the first nitrogen-containing layer by atomic layer deposition, the first WN$_x$ layer forming a barrier layer, wherein x is between 1 and 6;
   forming a second nitrogen-containing layer over the surface of the first WN$_x$ layer, forming the second nitrogen-containing layer comprising providing a gas that contains nitrogen, but no gases containing tungsten, to the top surface of the first WN$_x$ layer; and
   depositing a tungsten layer directly over the second nitrogen-containing layer, the tungsten layer reacting with the second nitrogen-containing layer so as to form a second WN$_x$ layer over the first WN$_x$ layer for additional protection of the silicon, depositing the tungsten layer over the second nitrogen-containing layer also forming a tungsten layer over the second WN$_x$ layer, where the tungsten layer over the second WN$_x$ layer does not contain nitrogen and acts as a highly conductive layer, the tungsten layer not containing nitrogen being thicker than the first WN$_x$ layer and the second WN$_x$ layer,
   wherein depositing a tungsten layer directly over the second nitrogen-containing layer comprises flowing WF$_6$ and SiH$_4$ in a CVD chamber.

8. A method for forming a conductor on a silicon surface comprising:
   removing native oxide from the silicon surface;
   forming a first nitrogen-containing layer on the silicon surface;
   forming a first WN$_x$ layer over the first nitrogen-containing layer by atomic layer deposition, the first WN$_x$ layer forming a barrier layer, wherein x is between 1 and 6;
   forming a second nitrogen-containing layer over the surface of the first WN$_x$ layer, forming the second nitrogen-containing layer comprising providing a gas that contains nitrogen, but no gases containing tungsten, to the top surface of the first WN$_x$ layer; and
   depositing a tungsten layer directly over the second nitrogen-containing layer, the tungsten layer reacting with the second nitrogen-containing layer so as to form a second WN$_x$ layer over the first WN$_x$ layer for additional protection of the silicon, depositing the tungsten layer over the second nitrogen-containing layer also forming a tungsten layer over the second WN$_x$ layer, where the tungsten layer over the second WN$_x$ layer does not contain nitrogen and acts as a highly conductive layer, the tungsten layer not containing nitrogen being thicker than the first WN$_x$ layer and the second WN$_x$ layer; and
   etching the tungsten layer to form a patterned tungsten interface between the silicon surface and a metal layer.

9. A method for forming a conductor on a silicon surface comprising:
   removing native oxide from the silicon surface;
   forming a first nitrogen-containing layer on the silicon surface, wherein forming a first nitrogen-containing layer comprises forming a first nitrogen-containing layer from about 1 nm to 3 nm thick;
   forming a first WN$_x$ layer over the first nitrogen-containing layer by atomic layer deposition, the first WN$_x$ layer forming a barrier layer, wherein x is between 1 and 6;
   forming a second nitrogen-containing layer over the surface of the first WN$_x$ layer, forming the second nitrogen-containing layer comprising providing a gas that contains nitrogen, but no gases containing tungsten, to the top surface of the first WN$_x$ layer; and
   depositing a tungsten layer directly over the second nitrogen-containing layer, the tungsten layer reacting with the second nitrogen-containing layer so as to form a second WN$_x$ layer over the first WN$_x$ layer for additional protection of the silicon, depositing the tungsten layer over the second nitrogen-containing layer also forming a tungsten layer over the second WN$_x$ layer, where the tungsten layer over the second WN$_x$ layer does not contain nitrogen and acts as a highly conductive layer, the tungsten layer not containing nitrogen being thicker than the first WN$_x$ layer and the second WN$_x$ layer.

10. The method of claim 8 wherein forming a first WN$_x$ layer comprises forming a first WN$_x$ layer from about 30 Å to 100 Å thick.

11. A method for forming a conductor on a silicon surface comprising:
   removing native oxide from the silicon surface;
   forming a first nitrogen-containing layer on the silicon surface;
   forming a first WN$_x$ layer over the first nitrogen-containing layer by atomic layer deposition, the first WN$_x$ layer forming a barrier layer, wherein x is between 1 and 6;
   forming a second nitrogen-containing layer over the surface of the first WN$_x$ layer, forming the second nitrogen-containing layer comprising providing a gas that contains nitrogen, but no gases containing tungsten, to the top surface of the first WN$_x$ layer; and
   depositing a tungsten layer directly over the second nitrogen-containing layer, the tungsten layer reacting with the second nitrogen-containing layer so as to form a second WN$_x$ layer over the first WN$_x$ layer for additional protection of the silicon, depositing the tungsten layer over the second nitrogen-containing layer also forming a tungsten layer over the second WN$_x$ layer, where the tungsten layer over the second WN$_x$ layer does not contain nitrogen and acts as a highly conductive layer, the tungsten layer not containing nitrogen being thicker than the first WN$_x$ layer and the second WN$_x$ layer.

12. The method of claim 11 wherein forming a second nitrogen-containing layer over the surface of the first WN$_x$ layer comprises exposing the surface of the first $WN_x$ layer to the gas that contains nitrogen.

13. The method of claim 11 wherein forming a second nitrogen-containing layer over the surface of the first $WN_x$ layer comprises forming a second nitrogen-containing layer directly on the surface of the first $WN_x$ layer.

* * * * *

UNITED STATES PATENT AND TRADEMARK OFFICE
CERTIFICATE OF CORRECTION

PATENT NO. : 7,160,802 B2  Page 1 of 1
APPLICATION NO. : 11/146884
DATED : January 9, 2007
INVENTOR(S) : Huong T. Nguyen and Dennis Hausmann It is certified that error appears in the above-identified patent and that said Letters Patent is hereby corrected as shown below:

Column 3, line 56, claim 1: Cancel "he" and substitute --the--.

Signed and Sealed this

Fourteenth Day of October, 2008

JON W. DUDAS
*Director of the United States Patent and Trademark Office*